United States Patent
Li et al.

(10) Patent No.: US 10,403,188 B2
(45) Date of Patent: Sep. 3, 2019

(54) SHIFT REGISTER UNIT, GATE DRIVING CIRCUIT AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Feng Li, Beijing (CN); Yu Ma, Beijing (CN); Yan Yan, Beijing (CN); Qi Sang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/937,452

(22) Filed: Mar. 27, 2018

(65) Prior Publication Data

US 2019/0114952 A1  Apr. 18, 2019

(30) Foreign Application Priority Data

Oct. 13, 2017  (CN) .......................... 2017 1 0952683

(51) Int. Cl.
*G09G 3/20* (2006.01)
*G11C 19/28* (2006.01)

(52) U.S. Cl.
CPC .............. *G09G 3/20* (2013.01); *G11C 19/28* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| | | | | |
|---|---|---|---|---|
| 2015/0043703 | A1* | 2/2015 | Tan ........................ | G11C 19/28 377/68 |
| 2015/0332784 | A1* | 11/2015 | Yan ....................... | G09G 3/3611 377/64 |
| 2016/0307641 | A1* | 10/2016 | Zheng ................... | G09G 3/3677 |
| 2016/0372031 | A1* | 12/2016 | Li .......................... | G09G 3/3225 |
| 2017/0162154 | A1* | 6/2017 | Cao ....................... | G09G 3/3677 |

* cited by examiner

*Primary Examiner* — Joseph R Haley
(74) *Attorney, Agent, or Firm* — Brooks Kushman P.C.

(57) ABSTRACT

A shift register unit, a gate driving circuit and a display device are provided. The shift register unit includes an input sub-circuit, a first output sub-circuit, a second output sub-circuit, an output resetting sub-circuit, a node resetting sub-circuit and a capacitor sub-circuit. A control end of the output resetting sub-circuit is connected to a second reference voltage signal end, so as to provide a second reference voltage signal from the second reference voltage signal end with a rising edge within a relatively short time period.

20 Claims, 4 Drawing Sheets

SHIFT REGISTER UNIT, GATE DRIVING CIRCUIT AND DISPLAY DEVICE

CROSS-REFERENCE TO RELATED APPLICATION

This application claims priority to Chinese Patent Application No. 201710952683.4 filed on Oct. 13, 2017, which is incorporated herein by reference in its entirety.

TECHNICAL FIELD

The present disclosure relates to the field of display technology, in particular to a shift register unit, a gate driving circuit and a display device.

BACKGROUND

Along with the rapid development of the display technology, there has been a trend to provide a display device with high integration and low manufacture cost. A Gate Driver on Array (GOA) technique has been proposed, so as to integrate a Thin Film Transistor (TFT) gate switching circuit into an array substrate of a display panel, thereby to scan and drive the display panel. In this way, it is able to omit a layout space for a bonding region and a fan-out region of a gate Integrated Circuit (IC), reduce the manufacture cost in terms of materials and manufacture processes, and provide the display panel with a symmetrical shape and a narrow bezel. In addition, through this integration process, it is able to omit a bonding process in a direction of a gate scanning line, thereby to improve the capacity and yield.

SUMMARY

In one aspect, the present disclosure provides in some embodiments a shift register unit, including an input sub-circuit, a first output sub-circuit, a second output sub-circuit, an output resetting sub-circuit, a node resetting sub-circuit and a capacitor sub-circuit. The input sub-circuit is configured to apply a signal from a signal input end to a first node under the control of the signal input end. The first output sub-circuit is configured to apply a clock signal from a clock signal end to a first signal output end under the control of a potential at the first node. The capacitor sub-circuit is configured to maintain a stable voltage difference between the first node and the first signal output end. The second output sub-circuit is configured to apply a third reference voltage signal from a third reference voltage signal end to a second signal output end under the control of the potential at the first node. The node resetting sub-circuit is configured to apply a first reference voltage signal from a first reference voltage signal end to the first node under the control of a resetting signal end. The output resetting sub-circuit is configured to apply the first reference voltage signal from the first reference voltage signal end to the second signal output end under the control of a second reference voltage signal end. A second reference voltage signal from the second reference voltage signal end has a clock period same as, and a phase different from, the clock signal from the clock signal end.

In a possible embodiment of the present disclosure, the input sub-circuit includes a first switching transistor, a gate electrode and a first electrode of which are connected to the signal input end, and a second electrode of which is connected to the first node.

In a possible embodiment of the present disclosure, the first output sub-circuit includes a second switching transistor, a gate electrode of which is connected to the first node, a first electrode of which is connected to the clock signal end, and a second electrode of which is connected to the first signal output end.

In a possible embodiment of the present disclosure, the second output sub-circuit includes a third switching transistor, a gate electrode of which is connected to the first node, a first electrode of which is connected to the third reference voltage signal end, and a second electrode of which is connected to the second signal output end.

In a possible embodiment of the present disclosure, the capacitor sub-circuit includes a first capacitor, a first end of which is connected to the first node, and a second end of which is connected to the first signal output end.

In a possible embodiment of the present disclosure, the output resetting sub-circuit includes a fourth switching transistor, a gate electrode of which is connected to the second reference voltage signal end, a second electrode of which is connected to the first reference voltage signal end, and a first electrode of which is connected to the second signal output end.

In a possible embodiment of the present disclosure, the node resetting sub-circuit includes a fifth switching transistor, a gate electrode of which is connected to the resetting signal end, a second electrode of which is connected to the first reference voltage signal end, and a first electrode of which is connected to the first node.

In a possible embodiment of the present disclosure, the shift register unit further includes a node noise reduction sub-circuit configured to apply the first reference voltage signal from the first reference voltage signal end to the first node under the control of a frame start signal end.

In a possible embodiment of the present disclosure, the node noise reduction sub-circuit includes a sixth switching transistor, a gate electrode of which is connected to the frame start signal end, a second electrode of which is connected to the first reference voltage signal end, and a first electrode of which is connected to the first node.

In a possible embodiment of the present disclosure, the shift register unit further includes a pull-down control sub-circuit configured to apply the first reference voltage signal from the first reference voltage signal end to a second node under the control of the signal input end or a potential at the first node, or apply a fourth reference voltage signal from a fourth reference voltage signal end to the second node under the control of the fourth reference voltage signal end.

In a possible embodiment of the present disclosure, the pull-down control sub-circuit includes a seventh switching transistor, an eighth switching transistor and a ninth switching transistor. A gate electrode and a first electrode of the seventh switching transistor are connected to the fourth reference voltage signal end, and a second electrode thereof is connected to the second node. A gate electrode of the eighth switching transistor is connected to the first node, a first electrode thereof is connected to the first reference voltage signal end, and a second electrode thereof is connected to the second node. A gate electrode of the ninth switching transistor is connected to the signal input end, a first electrode thereof is connected to the first reference voltage signal end, and a second electrode thereof is connected to the second node.

In a possible embodiment of the present disclosure, the shift register unit further includes a pull-down sub-circuit configured to apply the first reference voltage signal from the first reference voltage signal end to the first node, the first signal output end and the second signal output end under the control of a potential at the second node.

In a possible embodiment of the present disclosure, the pull-down sub-circuit includes a tenth switching transistor, an eleventh switching transistor and a twelfth switching transistor. A gate electrode of the tenth switching transistor is connected to the second node, a first electrode thereof is connected to the first reference voltage signal end, and a second electrode thereof is connected to the first node. A gate electrode of the eleventh switching transistor is connected to the second node, a second electrode thereof is connected to the first reference voltage signal end, and a first electrode thereof is connected to the first signal output end. A gate electrode of the twelfth switching transistor is connected to the second node, a second electrode thereof is connected to the first reference voltage signal end, and a first electrode thereof is connected to the second signal output end.

In a possible embodiment of the present disclosure, the shift register unit further includes an output noise reduction sub-circuit configured to apply the first reference voltage signal from the first reference voltage signal end to the second signal output end under the control of the frame start signal end.

In a possible embodiment of the present disclosure, the output noise reduction sub-circuit includes a thirteenth switching transistor, a gate electrode of which is connected to the frame start signal end, a first electrode of which is connected to the first reference voltage signal end, and a second electrode of which is connected to the second signal output end.

In another aspect, the present disclosure provides in some embodiments a gate driving circuit including a plurality of the above-mentioned shift register units connected in a cascaded manner.

In a possible embodiment of the present disclosure, apart from a first-level shift register unit, a first signal output end of a current-level shift register unit is connected to a resetting signal end of a previous-level shift register unit, and apart from a last-level shift register unit, the first signal output end of the current-level shift register unit is connected to a signal input end of a next-level shift register unit.

In a possible embodiment of the present disclosure, a signal input end of the first-level shift register unit is connected to a frame start signal end.

In a possible embodiment of the present disclosure, first reference voltage signal ends of all the shift register units are connected to a first reference voltage signal line, second reference voltage signal ends of all the shift register units are connected to a second reference voltage signal line, third reference voltage signal ends of all the shift register units are connected to a third reference voltage signal line, fourth reference voltage signal ends of all the shift register units are connected to a fourth reference voltage signal line, first clock signal ends of the shift register units at odd-numbered levels are connected to a first clock signal line, second clock signal ends of the shift register units at the odd-numbered levels are connected to a second clock signal line, first clock signal ends of the shift register units at even-numbered levels are connected to the second clock signal line, second clock signal ends of the shift register units at the even-numbered levels are connected to the first clock signal line, and a clock signal form the first clock signal line is of a phase opposite to a clock signal from the second clock signal line.

In yet another aspect, the present disclosure provides in some embodiments a display device including the above-mentioned gate driving circuit.

DETAILED DESCRIPTION

In order to make the objects, the technical solutions and the advantages of the present disclosure more apparent, the present disclosure will be described hereinafter in a clear and complete manner in conjunction with the drawings and embodiments. The following embodiments are for illustrative purposes only, but shall not be used to limit the scope of the present disclosure. The embodiments and the features therein may be combined in any form in the case of no conflict.

Usually, a gate driving circuit consists of a plurality of shift register units connected in a cascaded manner. A driving signal output end of a current-level shift register unit is connected to a gate line, and a scanning signal is inputted to the gate lines of the display panel sequentially through the shift register units. In a conventional shift register unit, an on state of a switching transistor is controlled through a resetting signal end, and low level signal is applied to a signal output end, so as to discharge the signal output end. However, a signal applied to the resetting signal end is just a signal from a previous-level shift register unit. This signal has a rising edge with a relatively long time period. Hence, it is necessary to provide a large switching transistor, so as to meet the requirement on resetting the signal output end. But the large switching transistor is adverse to the implementation of a narrow-bezel product and the reduction in the power consumption.

Hence, there is an urgent need to provide the narrow-bezel product and reduce the power consumption while meeting the requirement on resetting the signal output end.

Figure 1:
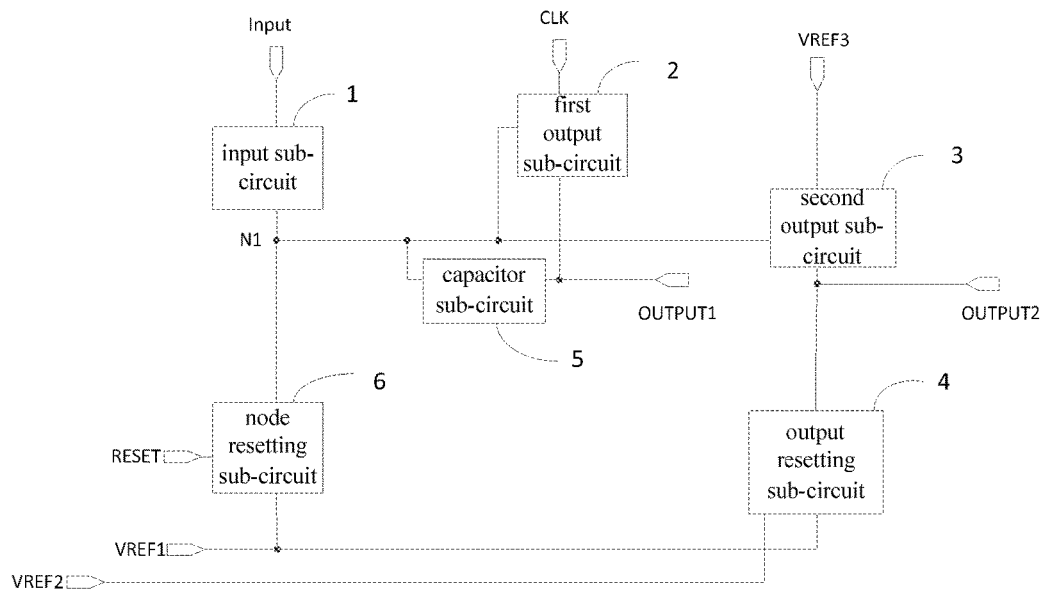
FIG. 1 is a schematic view showing a shift register unit according to one embodiment of the present disclosure.

The present disclosure provides in some embodiments a shift register unit which, as shown in FIG. 1, includes an input sub-circuit 1, a first output sub-circuit 2, a second output sub-circuit 3, an output resetting sub-circuit 4, a node resetting sub-circuit 6 and a capacitor sub-circuit 5. The input sub-circuit 1 is configured to apply a signal from a signal input end INPUT to a first node N1 under the control of the signal input end INPUT. The first output sub-circuit 2 is configured to apply a clock signal from a clock signal end CLK to a first signal output end OUTPUT1 under the control of a potential at the first node N1. The capacitor sub-circuit 5 is configured to maintain a stable voltage difference between the first node N1 and the first signal output end OUTPUT1. The second output sub-circuit 3 is configured to apply a third reference voltage signal from a third reference voltage signal end VREF3 to a second signal output end OUTPUT2 under the control of the potential at the first node N1. The node resetting sub-circuit 6 is configured to apply a first reference voltage signal from a first reference voltage signal end VREF1 to the first node N1 under the control of a resetting signal end RESET. The output resetting sub-circuit 4 is configured to apply the first reference voltage signal from the first reference voltage signal end VREF1 to the second signal output end OUTPUT2 under the control of a second reference voltage signal end VREF2. A second reference voltage signal from the second reference voltage signal end VREF2 has a clock period same as, and a phase different from, the clock signal from the clock signal end CLK.

According to the embodiments of the present disclosure, the shift register unit includes the input sub-circuit, the first output sub-circuit, the second output sub-circuit, the output resetting sub-circuit, the node resetting sub-circuit and the capacitor sub-circuit. The input sub-circuit is configured to apply the signal from the signal input end to the first node under the control of the signal input end. The first output sub-circuit is configured to apply the clock signal from the clock signal end to the first signal output end under the control of the potential at the first node. The capacitor sub-circuit is configured to maintain the stable voltage difference between the first node and the first signal output end. The second output sub-circuit is configured to apply the third reference voltage signal from the third reference voltage signal end to the second signal output end under the control of the potential at the first node. The node resetting sub-circuit is configured to apply the first reference voltage signal from the first reference voltage signal end to the first node under the control of the resetting signal end. The output resetting sub-circuit is configured to apply the first reference voltage signal from the first reference voltage signal end to the second signal output end under the control of the second reference voltage signal end. The second reference voltage signal from the second reference voltage signal end has a clock period same as, and a phase different from, the clock signal from the clock signal end. A control end of the output resetting sub-circuit is connected to the second reference voltage signal end, so as to provide the second reference voltage signal from the second reference voltage signal end with a rising edge within a relatively short time period. As a result, it is able for the output resetting sub-circuit to reset the second signal output end merely using a small element, thereby to reduce the power consumption and provide a narrow-bezel product.

It should be appreciated that, the second reference voltage signal from the second reference voltage signal end is a signal having a clock period same as, and a phase opposite to, the clock signal from the clock signal end, and the rising edge of the second reference voltage signal takes a time period shorter than a rising edge of a signal from a resetting signal end. Hence, as compared with a situation where the signal output end is reset using the signal from the resetting signal end, it is able for the output resetting sub-circuit to reset the second signal output end merely using a small element.

During the implementation, as shown in FIG. 1, the input sub-circuit 1 is connected to the signal input end INPUT and the first node N1, the first output sub-circuit 2 is connected to the first node N1, the clock signal end CLK and the first signal output end OUTPUT1, the capacitor sub-circuit 5 is connected to the first node N1 and the first signal output end OUTPUT1, the second output sub-circuit 3 is connected to the first node N1, the third reference voltage signal end VREF3 and the second signal output end OUTPUT2, the node resetting sub-circuit 6 is connected to the resetting signal end RESET, the first reference voltage signal end VREF1 and the first node N1, and the output resetting sub-circuit 4 is connected to the second reference voltage signal end VREF2, the first reference voltage signal end and the second signal output end OUTPUT2.

It should be appreciated that, the signals from the first signal output end and the second signal output end are same to each other. The signal from the first signal output end is used for a cascading operation of the shift register units of a gate driving circuit, and the signal form the second signal output end is used for controlling the gate line.

The present disclosure will be described hereinafter in conjunction with the embodiments. It should be appreciated that, the embodiments are for illustrative purposes only, but shall not be used to limit the scope of the present disclosure.

Figure 2:
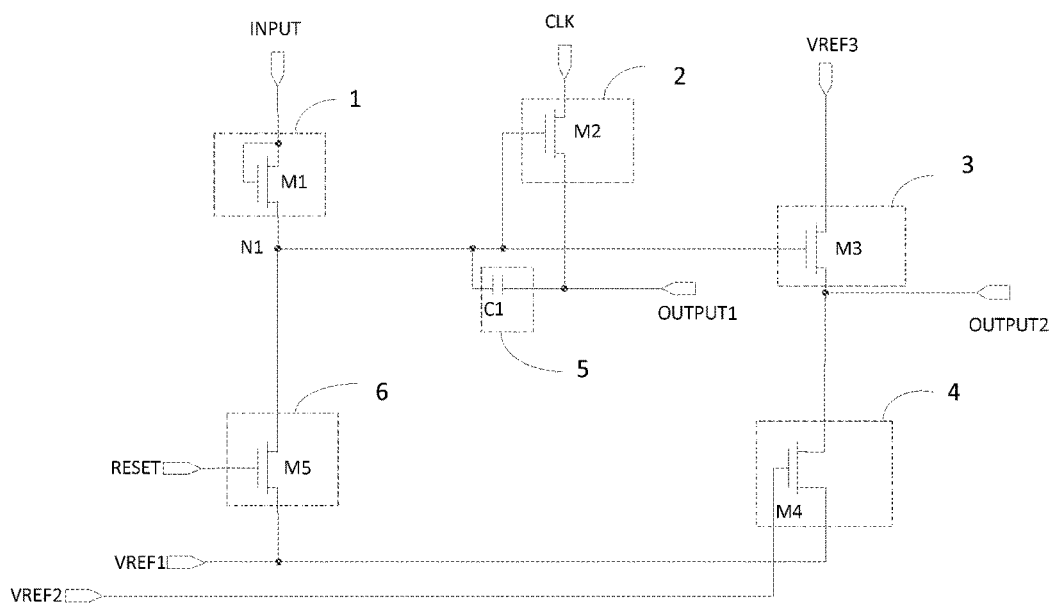
FIG. 2 is a circuit diagram of the shift register unit according to one embodiment of the present disclosure.

During the implementation, as shown in FIG. 2, the input sub-circuit 1 includes a first switching transistor M1, a gate electrode and a first electrode of which are connected to the signal input end INPUT, and a second electrode of which is connected to the first node N1.

A structure of the input sub-circuit of the shift register unit has been described hereinabove. However, the structure of the input sub-circuit shall not be limited thereto, and the input sub-circuit may have any known structure, which will not be particularly defined herein.

During the implementation, as shown in FIG. 2, the first output sub-circuit 2 includes a second switching transistor M2, a gate electrode of which is connected to the first node N1, a first electrode of which is connected to the clock signal end CLK, and a second electrode of which is connected to the first signal output end OUTPUT1.

A structure of the first output sub-circuit of the shift register unit has been described hereinabove. However, the structure of the first output sub-circuit shall not be limited thereto, and the first output sub-circuit may have any known structure, which will not be particularly defined herein.

During the implementation, as shown in FIG. 2, the second output sub-circuit 3 includes a third switching transistor M3, a gate electrode of which is connected to the first node N1, a first electrode of which is connected to the third reference voltage signal end VREF3, and a second electrode of which is connected to the second signal output end OUTPUT2.

A structure of the second output sub-circuit of the shift register unit has been described hereinabove. However, the structure of the second output sub-circuit shall not be limited thereto, and the second output sub-circuit may have any known structure, which will not be particularly defined herein.

During the implementation, as shown in FIG. 2, the capacitor sub-circuit 5 includes a first capacitor C1, a first end of which is connected to the first node N1, and a second end of which is connected to the first signal output end OUTPUT1.

A structure of the capacitor sub-circuit of the shift register unit has been described hereinabove. However, the structure of the capacitor sub-circuit shall not be limited thereto, and the capacitor sub-circuit may have any known structure, which will not be particularly defined herein.

During the implementation, as shown in FIG. 2, the output resetting sub-circuit 4 includes a fourth switching transistor M4, a gate electrode of which is connected to the second reference voltage signal end VREF2, a second electrode of which is connected to the first reference voltage signal end VREF1, and a first electrode of which is connected to the second signal output end OUTPUT2.

A structure of the output resetting sub-circuit of the shift register unit has been described hereinabove. However, the structure of the output resetting sub-circuit shall not be limited thereto, and the output resetting sub-circuit may have any known structure, which will not be particularly defined herein.

During the implementation, as shown in FIG. 2, the node resetting sub-circuit 6 includes a fifth switching transistor M5, a gate electrode of which is connected to the resetting signal end RESET, a second electrode of which is connected to the first reference voltage signal end VREF1, and a first electrode of which is connected to the first node N1.

A structure of the node resetting sub-circuit of the shift register unit has been described hereinabove. However, the structure of the node resetting sub-circuit shall not be limited thereto, and the node resetting sub-circuit may have any known structure, which will not be particularly defined herein.

Figure 3:
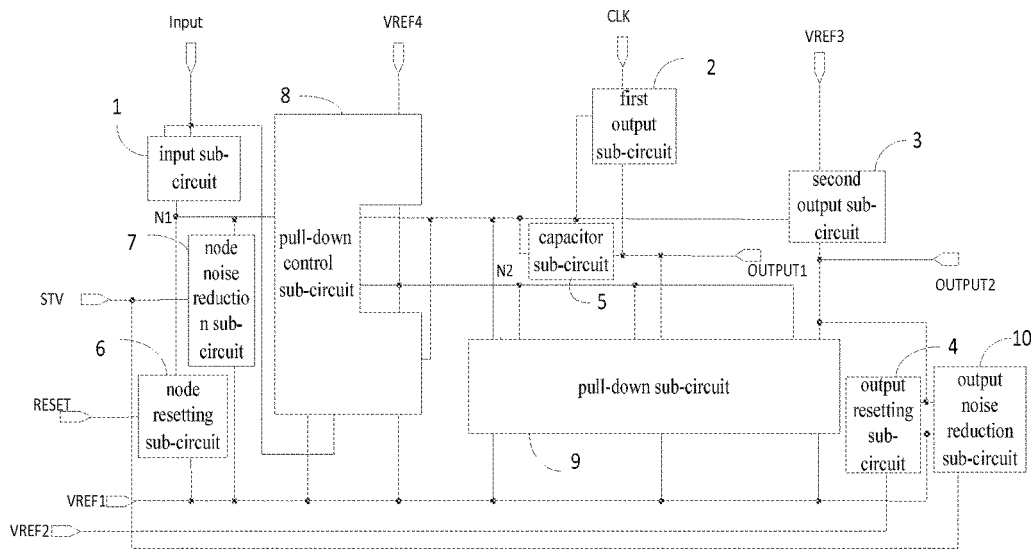
FIG. 3 is another schematic view showing the shift register unit according to another embodiment of the present disclosure.

During the implementation, as shown in FIG. 3, the shift register unit further includes a node noise reduction sub-circuit 7 configured to apply the first reference voltage signal from the first reference voltage signal end VREF1 to the first node N1 under the control of a frame start signal end STV.

During the implementation, through the node noise reduction sub-circuit, it is able to perform a noise reduction operation on the first node before a scanning operation within a current frame, thereby to prevent the scanning operation within the current frame from being adversely affected by a remaining signal within a previous frame.

Figure 4:
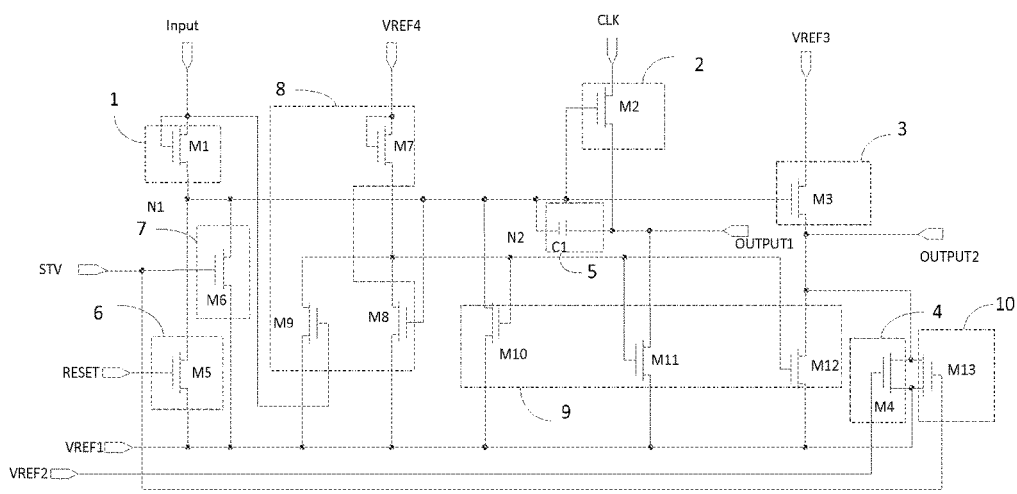
FIG. 4 is a circuit diagram of the shift register unit according to another embodiment of the present disclosure.

During the implementation, as shown in FIG. 4, the node noise reduction sub-circuit 7 includes a sixth switching transistor M6, a gate electrode of which is connected to the frame start signal end STV, a second electrode of which is connected to the first reference voltage signal end VREF1, and a first electrode of which is connected to the first node N1.

A structure of the node noise reduction sub-circuit of the shift register unit has been described hereinabove. However, the structure of the node noise reduction sub-circuit shall not be limited thereto, and the node noise reduction sub-circuit may have any known structure, which will not be particularly defined herein.

During the implementation, as shown in FIG. 3, the shift register unit further includes a pull-down control sub-circuit 8 configured to apply the first reference voltage signal from the first reference voltage signal end VREF1 to a second node N2 under the control of the signal input end INPUT or a potential at the first node N1, or apply a fourth reference voltage signal from a fourth reference voltage signal end VREF4 to the second node N2 under the control of the fourth reference voltage signal end VREF4.

During the implementation, the pull-down control sub-circuit is connected with the signal input end, a potential at the first node N1, the first reference voltage signal end, the second node and the fourth reference voltage signal end.

To be specific, as shown in FIG. 4, the pull-down control sub-circuit 8 includes a seventh switching transistor M7, an eighth switching transistor M8 and a ninth switching transistor M9. A gate electrode and a first electrode of the seventh switching transistor M7 are connected to the fourth reference voltage signal end VREF4, and a second electrode thereof is connected to the second node N2. A gate electrode of the eighth switching transistor M8 is connected to the first node N1, a first electrode thereof is connected to the first reference voltage signal end VREF1, and a second electrode thereof is connected to the second node N2. A gate electrode of the ninth switching transistor M9 is connected to the signal input end INPUT, a first electrode thereof is connected to the first reference voltage signal end VREF1, and a second electrode thereof is connected to the second node N2.

During the implementation, the seventh switching transistor is configured to apply the fourth reference voltage signal from the fourth reference voltage signal end to the second node under the control of the fourth reference voltage signal end, the eighth switching transistor is configured to apply the first reference voltage signal from the first reference voltage signal end to the second node under the control of the potential at the first node, and the ninth switching transistor is configured to apply the first reference voltage signal from the first reference voltage signal end to the second node under the control of the signal input end.

A structure of the pull-down control sub-circuit of the shift register unit has been described hereinabove. However, the structure of the pull-down control sub-circuit shall not be limited thereto, and the pull-down control sub-circuit may have any known structure, which will not be particularly defined herein.

During the implementation, as shown in FIG. 3, the shift register unit further includes a pull-down sub-circuit 9 configured to apply the first reference voltage signal from the first reference voltage signal end VREF1 to the first node N1, the first signal output end OUTPUT1 and the second signal output end OUTPUT2 under the control of a potential at the second node N2.

During the implementation, the pull-down sub-circuit is connected to the second node, the first reference voltage signal end, the first node, the first signal output end and the second signal output end.

To be specific, as shown in FIG. 4, the pull-down sub-circuit 9 includes a tenth switching transistor M10, an eleventh switching transistor M11 and a twelfth switching transistor M12. A gate electrode of the tenth switching transistor M10 is connected to the second node N2, a first electrode thereof is connected to the first reference voltage signal end VREF1, and a second electrode thereof is connected to the first node N1. A gate electrode of the eleventh switching transistor M11 is connected to the second node N2, a second electrode thereof is connected to the first reference voltage signal end VREF1, and a first electrode thereof is connected to the first signal output end OUTPUT1. A gate electrode of the twelfth switching transistor M12 is connected to the second node N2, a second electrode thereof is connected to the first reference voltage signal end VREF1, and a first electrode thereof is connected to the second signal output end OUTPUT2.

During the implementation, the tenth switching transistor is configured to apply the first reference voltage signal from the first reference voltage signal end to the first node under the control of the potential at the second node, the eleventh switching transistor is configured to apply the first reference voltage signal from the first reference voltage signal end to the first signal output end under the control of the potential at the second node, and the twelfth switching transistor is configured to apply the first reference voltage signal from the first reference voltage signal end to the second signal output end under the control of the potential at the second node.

A structure of the pull-down sub-circuit of the shift register unit has been described hereinabove. However, the structure of the pull-down sub-circuit shall not be limited thereto, and the pull-down sub-circuit may have any known structure, which will not be particularly defined herein.

During the implementation, as shown in FIG. 3, the shift register unit further includes an output noise reduction sub-circuit 10 configured to apply the first reference voltage signal from the first reference voltage signal end VREF1 to the second signal output end OUTPUT2 under the control of the frame start signal end STV.

During the implementation, through the output noise reduction sub-circuit, it is able to perform the noise reduction operation on the second signal output end under the control of the frame start signal end before a current frame, so as to prevent the signal outputted within the current frame from being adversely affected by the remaining signal within a previous frame.

To be specific, as shown in FIG. 4, the output noise reduction sub-circuit 10 includes a thirteenth switching transistor M13, a gate electrode of which is connected to the frame start signal end STV, a first electrode of which is connected to the first reference voltage signal end VREF1, and a second electrode of which is connected to the second signal output end OUTPUT2.

A structure of the output noise reduction sub-circuit of the shift register unit has been described hereinabove. However, the structure of the output noise reduction sub-circuit shall not be limited thereto, and the output noise reduction sub-circuit may have any known structure, which will not be particularly defined herein.

In order to simplify the manufacture process, all the switching transistor of the shift register unit may be N-type switching transistors or P-type switching transistors, which will not be particularly defined herein.

During the implementation, each N-type switching transistor is turned on under the effect of a high-level signal, and turned off under the effect of a low-level signal. Each P-type switching transistor is turned off under the effect of the high-level signal, and turned on under the effect of the low-level signal.

It should be appreciated that, the switching transistors mentioned hereinabove may be Thin Film Transistors (TFTs) or Metal Oxide Semiconductor Field Effect Transistors (MOSFETs), which will not be particularly defined herein. During the implementation, a control electrode of each switching transistor is the gate electrode. Depending on the type of the transistor and the input signal, the first electrode may be a source electrode and the second electrode may be a drain electrode, or the first electrode may be a drain electrode and the second electrode may be a source electrode.

An operating procedure of the shift register unit will be described hereinafter in conjunction with a sequence diagram. In the following description, 1 represents a high-level signal and 0 represents a low-level signal. To be specific, 1 and 0 are used to represent logic potentials, and they are used to facilitate the understanding of the operating procedure thereof, rather than to show the actual potentials applied onto the gate electrodes of the switching transistors.

Figure 5:
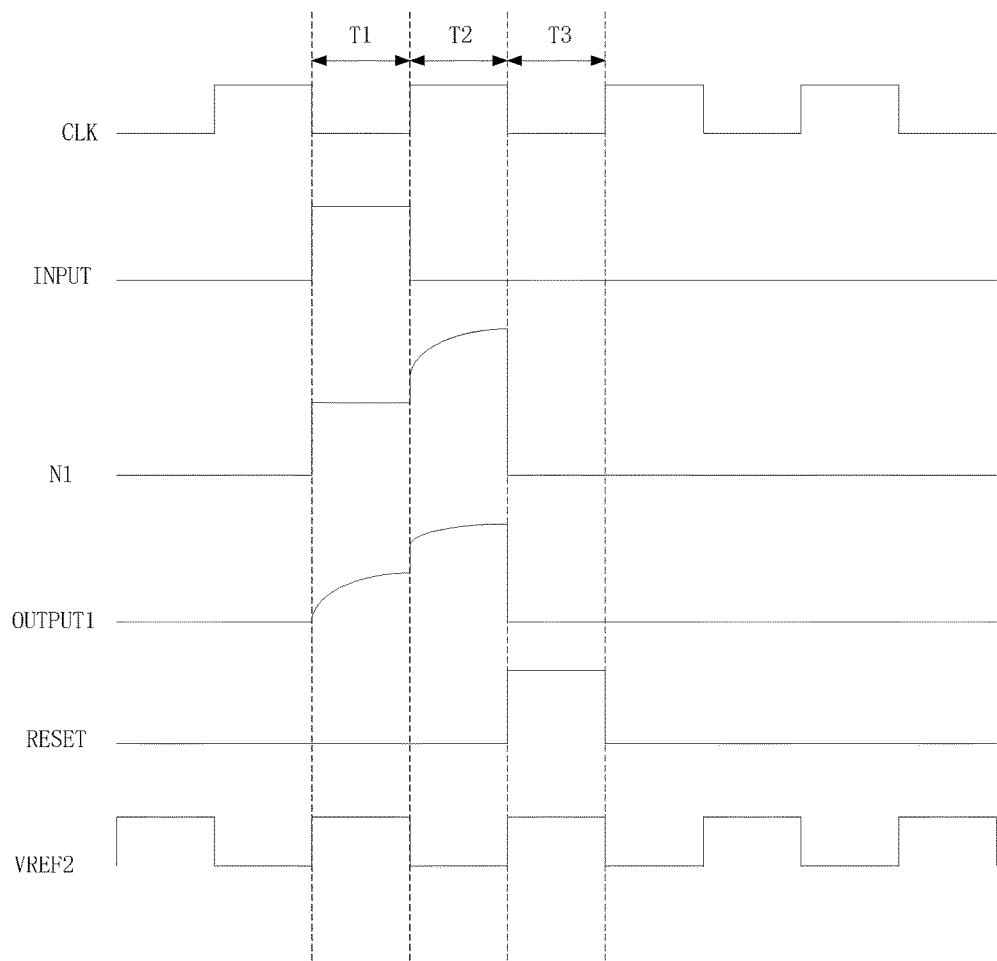
FIG. 5 is a sequence diagram of the shift register unit in FIG. 2.

Taking the shift register unit in FIG. 2 as an example, all the transistors are N-type transistors. The signal from the first reference voltage signal end VREF1 is a low-level signal, the signal from the second reference voltage signal end VREF2 is a high-level signal, and the signal from the third reference voltage signal end VREF3 is a high-level signal. FIG. 5 is the sequence diagram showing input and output signals. To be specific, three stages in FIG. 5, i.e., T1 to T3, may be selected.

At T1, INPUT=1, VREF2=1, CLK=0 and RESET=0.

Because INPUT=1, the first switching transistor M1 is turned on so as to apply the signal from the signal input end INPUT to the first node N1, i.e., to charge the first node N1, thereby to maintain the first node N1 at a high potential. Because the first node N1 is at a high potential, the third switching transistor M3 is turned on, so as to apply the third reference voltage signal from the third reference voltage signal end VREF3 to the second signal output end OUTPUT2 via the third switching transistor M3 in an on state. The second reference voltage signal from the second reference voltage signal end VREF2 is at a high level, so the fourth switching transistor M4 is turned on to apply the first reference voltage signal from the first reference voltage signal end VREF1 to the second signal output end OUTPUT2. At this time, the potential at the second signal output end OUTPUT2 may be pulled down to some extent. T1 is not a signal output stage, so the signal from the second signal output end OUTPUT2 may be not affected. Because CLK=0, there is no signal from the first signal output end OUTPUT1.

At T2, INPUT=0, VREF2=0, CLK=1, and RESET=0.

At this stage, the first node N1 is still maintained at the high potential like at T1, so the second switching transistor M2 is turned on, so as to apply the clock signal from the clock signal end CLK to the first signal output end OUTPUT1. At this time, the third switching transistor M3 is turned on due to the high potential at the first node N1, so as to apply the third reference voltage signal from the third reference voltage signal end VREF3 to the second signal output end OUTPUT2.

At T3, INPUT=0, VREF2=1, CLK=0 and RESET=1.

Because RESET=1, the fifth switching transistor M5 is turned on, so as to apply the first reference voltage signal from the first reference voltage signal end VREF1 to the first node N1 and reset the first node N1. Because VREF2=1, the fourth switching transistor M4 is turned on, so as to apply the first reference voltage signal from the first reference voltage signal end VREF1 to the second signal output end OUTPUT2 and reset the second signal output end OUTPUT2. The second reference voltage signal from the second reference voltage signal end VREF2 has a rising edge within a relatively short time period, so it is merely necessary to provide a small-size fourth switching transistor M4. As a result, it is able to reduce a space occupied by the fourth switching transistor M4, provide a narrow-bezel product, and reduce the power consumption.

Figure 6:
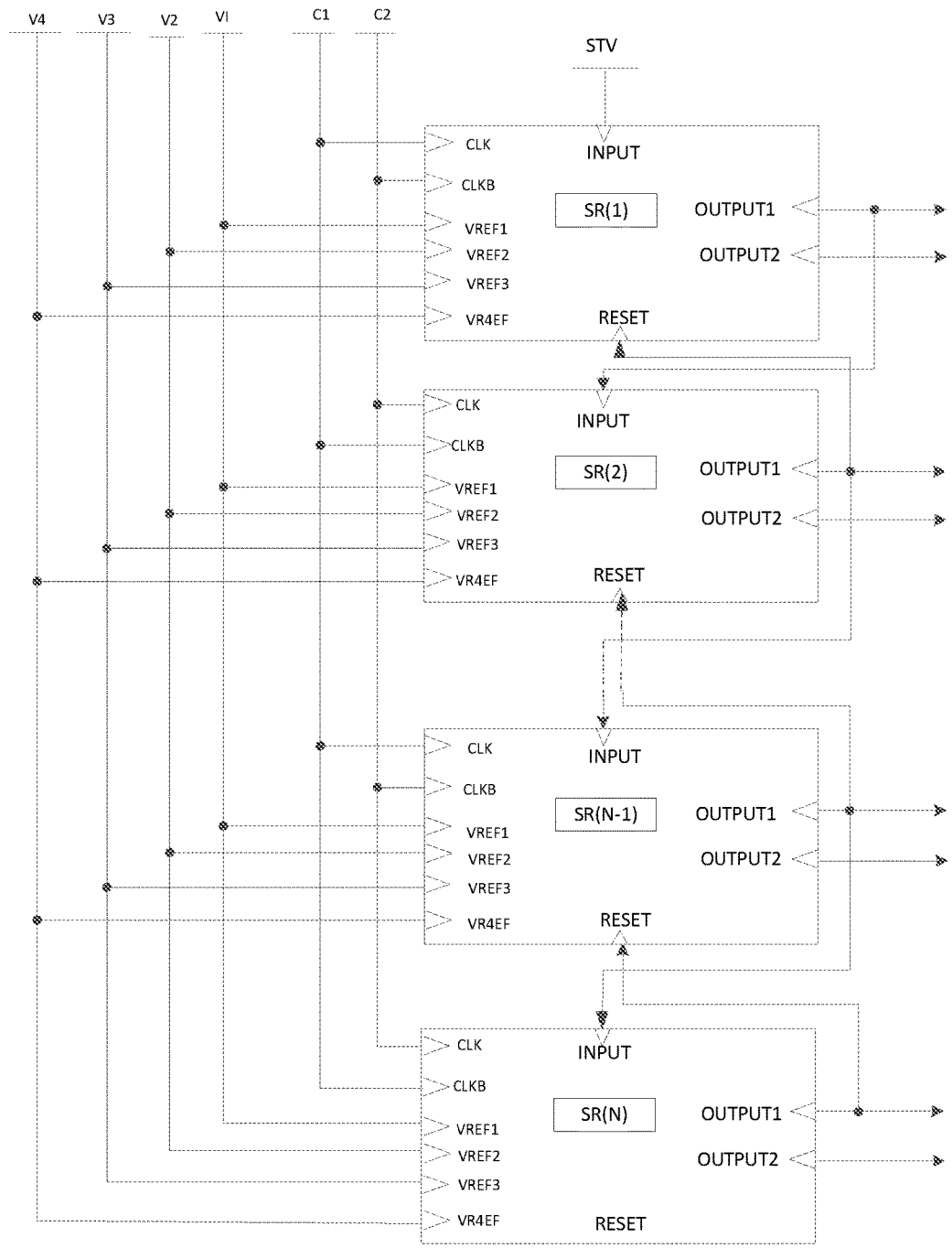
FIG. 6 is a schematic view showing a gate driving circuit according to one embodiment of the present disclosure.

Based on an identical inventive concept, the present disclosure further provides in some embodiments a gate driving circuit which, as shown in FIG. 6, includes a plurality of the above-mentioned shift register units connected in a cascaded manner, i.e., SR(1), SR(2), SR(n), SR(N−1) and SR(N) (1<n<N).

Apart from a first-level shift register unit SR(1), a first signal output end OUTPUT1 of a current-level shift register unit SR(n) is connected to a resetting signal end RESET of a previous-level shift register unit SR(n−1), and apart from a last-level shift register unit SR(N), the first signal output end OUTPUT1 of the current-level shift register unit SR(n) is connected to a signal input end INPUT of a next-level shift register unit SR(n+1).

During the implementation, as shown in FIG. 6, the signal input end INPUT of the first-level shift register unit SR(1) is connected to the frame start signal end STV.

During the implementation, first reference voltage signal ends VREF1 of all the shift register units are connected to a first reference voltage signal line V1, second reference voltage signal ends VREF2 of all the shift register units are connected to a second reference voltage signal line V2, third reference voltage signal ends VREF3 of all the shift register units are connected to a third reference voltage signal line V3, fourth reference voltage signal ends VREF4 of all the shift register units are connected to a fourth reference voltage signal line V4, first clock signal ends CLK of the shift register units at odd-numbered levels are connected to a first clock signal line C1, second clock signal ends CLKB of the shift register units at the odd-numbered levels are connected to a second clock signal line C2, first clock signal ends CLK of the shift register units at even-numbered levels are connected to the second clock signal line C2, second clock signal ends CLKB of the shift register units at the even-numbered levels are connected to the first clock signal line C1, and a clock signal from the first clock signal line C1 is of a phase opposite to a clock signal from the second clock signal line C2.

Based on an identical inventive concept, the present disclosure further provides in some embodiments a display device including the above-mentioned gate driving circuit. The gate driving circuit is configured to apply a scanning signal to each gate line on an array substrate of the display device. The display device may be any product or member having a display function, such as mobile phone, flat-panel computer, television, display, laptop computer, digital photo frame or navigator. The implementation of the display device may refer to that of the gate driving circuit, which will not be particularly defined herein.

According to the shift register unit, the gate driving circuit and the display device in the embodiments of the present disclosure, the shift register unit includes the input sub-circuit, the first output sub-circuit, the second output sub-circuit, the output resetting sub-circuit, the node resetting sub-circuit and the capacitor sub-circuit. The input sub-circuit is configured to apply the signal from the signal input end to the first node under the control of the signal input end. The first output sub-circuit is configured to apply the clock signal from the clock signal end to the first signal output end under the control of the potential at the first node. The capacitor sub-circuit is configured to maintain the stable voltage difference between the first node and the first signal output end. The second output sub-circuit is configured to apply the third reference voltage signal from the third reference voltage signal end to the second signal output end under the control of the potential at the first node. The node resetting sub-circuit is configured to apply the first reference voltage signal from the first reference voltage signal end to the first node under the control of the resetting signal end. The output resetting sub-circuit is configured to apply the first reference voltage signal from the first reference voltage signal end to the second signal output end under the control of the second reference voltage signal end. The second reference voltage signal from the second reference voltage signal end has a clock period same as, and a phase different from, the clock signal from the clock signal end. A control end of the output resetting sub-circuit is connected to the second reference voltage signal end, so as to provide the second reference voltage signal from the second reference voltage signal end with a rising edge within a relatively short time period. As a result, it is able for the output resetting sub-circuit to reset the second signal output end merely using a small element, thereby to reduce the power consumption and provide a narrow-bezel product.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A shift register unit, comprising an input sub-circuit, a first output sub-circuit, a second output sub-circuit, an output resetting sub-circuit, a node resetting sub-circuit and a capacitor sub-circuit, wherein
   the input sub-circuit is configured to apply a signal from a signal input end to a first node under the control of the signal input end;
   the first output sub-circuit is configured to apply a clock signal from a clock signal end to a first signal output end under the control of a potential at the first node;
   the capacitor sub-circuit is configured to maintain a stable voltage difference between the first node and the first signal output end;
   the second output sub-circuit is configured to apply a third reference voltage signal from a third reference voltage signal end to a second signal output end under the control of the potential at the first node;
   the node resetting sub-circuit is configured to apply a first reference voltage signal from a first reference voltage signal end to the first node under the control of a resetting signal end;
   the output resetting sub-circuit is configured to apply the first reference voltage signal from the first reference voltage signal end to the second signal output end under the control of a second reference voltage signal end; and
   a second reference voltage signal from the second reference voltage signal end has a clock period same as, and a phase different from, the clock signal from the clock signal end.

2. The shift register unit according to claim 1, wherein the input sub-circuit comprises a first switching transistor, a gate electrode and a first electrode of the first switching transistor are connected to the signal input end, and a second electrode of the first switching transistor is connected to the first node.

3. The shift register unit according to claim 1, wherein the first output sub-circuit comprises a second switching transistor, a gate electrode of the second switching transistor is connected to the first node, a first electrode of the second switching transistor is connected to the clock signal end, and a second electrode of the second switching transistor is connected to the first signal output end.

4. The shift register unit according to claim 1, wherein the second output sub-circuit comprises a third switching transistor, a gate electrode of the third switching transistor is connected to the first node, a first electrode of the third switching transistor is connected to the third reference voltage signal end, and a second electrode of the third switching transistor is connected to the second signal output end.

5. The shift register unit according to claim 1, wherein the capacitor sub-circuit comprises a first capacitor, a first end of the first capacitor is connected to the first node, and a second end of the first capacitor is connected to the first signal output end.

6. The shift register unit according to claim 1, wherein the output resetting sub-circuit comprises a fourth switching transistor, a gate electrode of the fourth switching transistor is connected to the second reference voltage signal end, a second electrode of the fourth switching transistor is connected to the first reference voltage signal end, and a first electrode of the fourth switching transistor is connected to the second signal output end.

7. The shift register unit according to claim 1, wherein the node resetting sub-circuit comprises a fifth switching transistor, a gate electrode of the fifth switching transistor is connected to the resetting signal end, a second electrode of the fifth switching transistor is connected to the first reference voltage signal end, and a first electrode of the fifth switching transistor is connected to the first node.

8. The shift register unit according to claim 1, further comprising a node noise reduction sub-circuit configured to apply the first reference voltage signal from the first reference voltage signal end to the first node under the control of a frame start signal end.

9. The shift register unit according to claim 8, wherein the node noise reduction sub-circuit comprises a sixth switching transistor, a gate electrode of the sixth switching transistor is connected to the frame start signal end, a second electrode of the sixth switching transistor is connected to the first reference voltage signal end, and a first electrode of the sixth switching transistor is connected to the first node.

10. The shift register unit according to claim 1, further comprising a pull-down control sub-circuit configured to apply the first reference voltage signal from the first reference voltage signal end to a second node under the control of the signal input end or a potential at the first node, or apply a fourth reference voltage signal from a fourth reference voltage signal end to the second node under the control of the fourth reference voltage signal end.

11. The shift register unit according to claim 10, wherein the pull-down control sub-circuit comprises a seventh switching transistor, an eighth switching transistor and a ninth switching transistor;
a gate electrode and a first electrode of the seventh switching transistor are connected to the fourth reference voltage signal end, and a second electrode of the seventh switching transistor is connected to the second node;
a gate electrode of the eighth switching transistor is connected to the first node, a first electrode of the eighth switching transistor is connected to the first reference voltage signal end, and a second electrode of the eighth switching transistor is connected to the second node; and
a gate electrode of the ninth switching transistor is connected to the signal input end, a first electrode of the ninth switching transistor is connected to the first reference voltage signal end, and a second electrode of the ninth switching transistor is connected to the second node.

12. The shift register unit according to claim 11, further comprising a pull-down sub-circuit configured to apply the first reference voltage signal from the first reference voltage signal end to the first node, the first signal output end and the second signal output end under the control of a potential at the second node.

13. The shift register unit according to claim 12, wherein the pull-down sub-circuit comprises a tenth switching transistor, an eleventh switching transistor and a twelfth switching transistor;
a gate electrode of the tenth switching transistor is connected to the second node, a first electrode of the tenth switching transistor is connected to the first reference voltage signal end, and a second electrode of the tenth switching transistor is connected to the first node;

a gate electrode of the eleventh switching transistor is connected to the second node, a second electrode of the eleventh switching transistor is connected to the first reference voltage signal end, and a first electrode of the eleventh switching transistor is connected to the first signal output end; and a gate electrode of the twelfth switching transistor is connected to the second node, a second electrode of the twelfth switching transistor is connected to the first reference voltage signal end, and a first electrode thereof is connected to the second signal output end.

14. The shift register unit according to claim 1, further comprising an output noise reduction sub-circuit configured to apply the first reference voltage signal from the first reference voltage signal end to the second signal output end under the control of a frame start signal end.

15. The shift register unit according to claim 14, wherein the output noise reduction sub-circuit comprises a thirteenth switching transistor, a gate electrode of the thirteenth switching transistor is connected to the frame start signal end, a first electrode of the thirteenth switching transistor is connected to the first reference voltage signal end, and a second electrode of the thirteenth switching transistor is connected to the second signal output end.

16. A gate driving circuit comprising a plurality of shift register units according to claim 1 connected to each other in a cascaded manner.

17. The gate driving circuit according to claim 16, wherein apart from a first-level shift register unit, a first signal output end of a current-level shift register unit is connected to a resetting signal end of a previous-level shift register unit, and apart from a last-level shift register unit, the first signal output end of the current-level shift register unit is connected to a signal input end of a next-level shift register unit.

18. The gate driving circuit according to claim 16, wherein a signal input end of the first-level shift register unit is connected to a frame start signal end.

19. The gate driving circuit according to claim 16, wherein first reference voltage signal ends of all the shift register units are connected to a first reference voltage signal line, second reference voltage signal ends of all the shift register units are connected to a second reference voltage signal line, third reference voltage signal ends of all the shift register units are connected to a third reference voltage signal line, fourth reference voltage signal ends of all the shift register units are connected to a fourth reference voltage signal line, first clock signal ends of the shift register units at odd-numbered levels are connected to a first clock signal line, second clock signal ends of the shift register units at the odd-numbered levels are connected to a second clock signal line, first clock signal ends of the shift register units at even-numbered levels are connected to the second clock signal line, second clock signal ends of the shift register units at the even-numbered levels are connected to the first clock signal line, and a clock signal from the first clock signal line is of a phase opposite to a clock signal from the second clock signal line.

20. A display device comprising the gate driving circuit according to claim 16.

* * * * *